United States Patent [19]

Nath et al.

[11] Patent Number: 4,654,468

[45] Date of Patent: Mar. 31, 1987

[54] PHOTOVOLTAIC DEVICE HAVING A PREDETERMINED CURRENT CARRYING CAPACITY

[75] Inventors: Prem Nath, Rochester; Dominic Crea, Mt. Clemens; Allen Murray, Clawson, all of Mich.

[73] Assignee: Energy Conversion Devices, Inc., Troy, Mich.

[21] Appl. No.: 773,709

[22] Filed: Sep. 9, 1985

[51] Int. Cl.[4] .............................................. H01L 31/06
[52] U.S. Cl. .................................... 136/256; 136/249; 136/258; 357/30; 357/65
[58] Field of Search .......... 136/256, 258 AM, 249 TJ; 357/65, 30

[56] References Cited

U.S. PATENT DOCUMENTS 4,240,842 12/1980 Lindmayer ........................... 136/256
4,419,530 12/1983 Nath ..................................... 136/251

OTHER PUBLICATIONS

*Electronics*, Sep. 11, 1980, pp. 40–41.

*Primary Examiner*—Aaron Weisstuch
*Attorney, Agent, or Firm*—Marvin S. Siskind; Ronald W. Citkowski

[57] ABSTRACT

An improved photovoltaic device having a preselected current carrying capacity includes an electrically conductive body, an electrically insulating layer disposed atop the conductive body and a current carrying electrically conductive pattern atop the insulating layer. The material forming the current carrying pattern infiltrates portions of the insulating layer and establishes electrical communication with the electrically conductive body in such a manner that the current carrying capacity of the device is proportional to the area which is infiltrated by the conductive material. Also disclosed herein are methods for the fabrication of the improved device.

11 Claims, 2 Drawing Figures

PHOTOVOLTAIC DEVICE HAVING A PREDETERMINED CURRENT CARRYING CAPACITY

FIELD OF THE INVENTION

This invention relates generally to electronic devices, and especially to thin film electronic devices. More particularly, the present invention relates to photovoltaic devices having current collection means such as a bus grid structure which has at least portions thereof electrically buffered, so as to limit to preselected values, the flow of electrical current through that structure, and consequently through the device. The invention is most specifically adapted for use in the manufacture of large area, thin film photovoltaic devices, insofar as it provides a structure and method for minimizing the effect of current shunting defects which are prevalent in said photovoltaic devices.

BACKGROUND OF THE INVENTION

Single crystal photovoltaic devices, especially silicon photovoltaic devices have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those produced by their crystalline counterparts. It is to be noted that the term "amorphous" as used herein, includes all materials or alloys which have long range disorder, although they may have short or intermediate range order or even contain, at times, crystalline inclusions.

It is now possible to prepare by glow discharge or other vapor deposition techniques, thin film amorphous silicon or germanium based alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," which issued to Stanford R. Ovshinsky and Arun Madan on Oct. 7, 1980 and in U.S. Pat. No. 4,217,374, under the same title, which issued on Aug. 12, 1980, to Stanford R. Ovshinky and Masatsugu Izu, and in U.S. Pat. No. 4,504,518 of Stanford R. Ovshinsky, David D. Allred, Lee Walter and Stephen J. Hudgens entitled "Method of Making Amorphous Semiconductor Alloys and Devices Using Microwave Energy," which issued on Mar. 12, 1985, and in U.S. Pat. No. 4,517,223 under the same title which issued on May 14, 1985 to Stanford R. Ovshinsky, David D. Allred, Lee Walter and Steven J. Hudgens, which patents are assigned to the assignees of the instant invention, the disclosures of which are incorporated herein by reference. As disclosed in these patents, it is believed that fluorine introduced into the amorphous semiconductor operates to substantially reduce the density of the localized states therein and facilitates the addition of other alloying materials.

The concept of utilizing multiple cells, to enhance photovoltaic device efficiency, was disclosed at least as early as 1955 by E. D. Jackson in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. As the assignee of the instant invention has shown however, such tandem structures are not only possible, but can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon and germanium alloys can be deposited in multiple layers over large area substrates to form solar cells in a high volume, continuous processing system. Such continuous processing systems are disclosed in the following U.S. Pat. Nos. 4,400,409, for "A Method of Making P-Doped Silicon Films And Devices Made Therefrom"; 4,410,588, for "Continuous Amorphous Solar Cell Deposition And Isolation System And Method"; 4,542,711, for "Continuous Systems For Depositing Amorphous Semiconductor Material"; 4,492,181 for "Method And Apparatus For Continuously Producing Tandem Amorphous Photovoltaic Cells"; and 4,485,125 for "Method And Apparatus For Continuously Producing Tandem Amorphous Photovoltaic Cells". As disclosed in these patents, the disclosures of which are incorporated herein by reference, a substrate may be continuously advanced through a succession of deposition chambers, wherein each chamber is dedicated to the deposition of a specific semiconductor material. In making a solar cell of n-i-p type configuration, the first chamber is dedicated for depositing a n-type amorphous silicon alloy, the second chamber is dedicated for depositing an intrinsic amorphous silicon alloy, and the third chamber is dedicated for depositing a p-type amorphous silicon alloy.

Since each deposited semiconductor alloy, and especially the intrinsic semiconductor alloy, must be of high purity; (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, as well as photodiodes, phototransistors, or the like. Additionally, by making multiple passes through the succession of deposition chambers, or by providing an additional array of deposition chambers, multiple stacked cells of various configurations may be obtained.

As should be apparent from the foregoing discussion, thin film amorphous semiconductor alloy materials offer several distinct advantages over crystalline materials, insofar as they can be easily and economically fabricated by the newly developed mass production processes. However, in the fabrication of semiconductor material by the aforementioned processes, the presence of current-shunting defects has been noted. These defects have (1) seriously impaired the performance of the photovoltaic devices fabricated therefrom and (2) detrimentally affected production yield. These process-related defects are thought to either (1) be present in the morphology of the substrate electrode, or (2) develop during the deposition of the semiconductor layers. It is to the end of eliminating, or at least substantially reducing the effects of these current-shunting defects to which the instant invention is directed.

The most important of these defects may be characterized as "shunts", "short-circuits", defect regions, or low resistance current paths. Before the suspected causes of these defects are explained, it will be helpful to note the thicknesses of the deposited layer of semiconductor alloy material. In a typical n-i-p type photovoltaic device, the "p" layer may be only on the order of 250 angstroms thick, the "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however small, will not be readily covered by the deposited semiconductor layers.

Shunt defects are present when one or more low resistance current paths develop between the electrodes of the photovoltaic device. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device.

While shunt-type defects always deleteriously affect the performance of photovoltaic devices, their effect is greatest when the devices in which they are incorporated are operated under relatively low illumination such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect region), whereas under AM-1 illumination, the load resistance is much lower by comparison. This occurs because, in a photovoltaic device, photogenerated current increases linearly with increasing illumination, while the resulting voltage increases exponentially. In other words, voltage attains a relatively high value under low illumination, the value increasing only slightly as the intensity of the illumination is increased. Therefore, under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity illumination, while more power may be lost to the defect region, the power lost represents a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein a photovoltaic device, initially exhibiting satisfactory electrical performance, suddenly fails. The failures will be referred to in this application as operational mode failures regardless of whether the device was previously connected to a load for the generation of power, it only being necessary that the device was, at some time, subjected to illumination, thereby initiating the generation of carriers. This type of failure will be discussed in further detail hereinbelow. It is believed the shunt defects, both latent and patent, arise from one or more irregularities in the (1) morphology of the substrate material, or (2) in the growth of the semiconductor layers.

The first, and perhaps most important, source of the defects, i.e., the aforementioned morphological irregularities in the deposition surface of the substrate material will now be discussed. Even though the highest quality stainless steel is employed to serve as the substrate or base electrode upon which the semiconductor layers are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, the defects may establish a low resistance current path through the semiconductor body, thereby effectively short-circuiting the two electrodes. This may occur in numerous ways. For instance, a spike projecting from the surface of the substrate electrode may be of too great a height to be covered by the subsequent deposition of semiconductor layers, and therefore, be in direct electrical contact with the other electrode when that electrode is deposited atop the semiconductor layers. Likewise, a crater formed in the surface of the substrate electrode may be of too small a size to be filled by the subsequent deposition of semiconductor layers and therefore, be in relatively close proximity to the other electrode, when that electrode is deposited atop the semiconductor layers. In such an instance; (1) electrical current may bridge the gap which exists between the electrodes, or (2) during actual use (the photoinduced generation of electrical current) of the photovoltaic device, the material of one of the electrodes may, under the influence of the electrical field, migrate toward and contact the other of the electrodes, and thereby pass electrical current therebetween. It is also possible that in some cases the semiconductor layers deposited onto the substrate include regions of irregular composition which can provide low resistance paths for the flow of electrical current between the electrodes of the photovoltaic device.

Further, despite all the previously described efforts to maintain the vacuum envelope free of external contaminants; dust or other particulate matter, which somehow either (1) invades the vacuum envelope during the deposition of the semiconductor material, or (2) forms as a by-product of the deposition process, may be deposited over the substrate electrode along with the semiconductor material. The contaminants interfere with the uniform deposition of the semiconductor layers and may establish the low resistance current paths therethrough.

Additionally, it is suspected that in some cases, the semiconductor material may form micro-craters or micro-projections during the deposition thereof, even absent the presence of contaminants or pollutants from external sources. Such morphological deviation from a perfectly smooth and even surface means that the substrate is covered by semiconductor alloy material either (1) in an "ultra thin layer" (consider again that the total thickness of all semiconductor layers is only on the order of 4,000 angstroms and any reduction in coverage is indeed an ultra thin layer) or (2) not at all. Obviously, when the upper electrode material is deposited across the entire surface of the semiconductor body, the defect regions cause the low resistance current path to develop, and electrical current is shunted therethrough. In still other cases involving defect regions, the presence of such defect regions are only detectable due to their deleterious effect upon the electrical and photoelectric properties of the resultant photovoltaic device. Finally, note the defects described hereinabove may not be sufficiently severe to divert all electrical current through the low resistance path. However, the diversion or shunting of any current therethrough represents a loss in operational efficiency of the photovoltaic device and should therefore be eliminated. Moreover, the shunting of even small amounts of current through each of thousands of defect regions may combine to cause major losses in efficiency. Based upon the foregoing, it should be apparent that a reduction in current flow through these defects and defect regions is critical to the fabrication of high-yield, high efficiency, large area thin film photovoltaic devices.

Several approaches dealing with this problem have been implemented by Applicants and their colleagues. As described in U.S. Pat. No. 4,451,970, of Masatsugu Izu and Vincent Cannella, entitled "System and Method For Eliminating Short Circuit Current Paths In Photovoltaic Devices," said patent assigned to the assignee of the instant application, the shunting of current through defect regions is treated by substantially eliminating the defect regions as an operative area of the semiconductor device. This is accomplished in an electrolytic process where electrode material is removed from the periphery of the defect site, effectively isolating the defect regions and preventing the flow of electrical current through the defect region. However, the process described in the '970 patent is current dependent, i.e., the greater the current flowing through a particular area of the device, such as a defect region, the greater the amount of electrode material (in the preferred embodiment indium tin oxide) removed. Consequently, said short circuit eliminating process performs admirably in removing the electrode material from the periphery of a large defect, and thereby preventing all current flow therethrough. However, it is not as successful in eliminating the flow of current between the electrodes in the thousands of defect regions which are relatively small. And as previously mentioned, since a great many relatively small current shunting paths taken in toto, divert a substantial amount of current from its desired path of travel, the low resistance current paths created by such small defect regions must also be eliminated or at least substantially reduced. Further, the electrolytic process described in the '970 Patent neither detects nor helps in preventing the formation of current-shunting paths in the case of operational mode failures.

In U.S. Pat. No. 4,419,530 to Prem Nath, entitled "Improved Solar Cell And Method For Producing Same", and assigned to the assignee of the instant patent application, there is described a method for electrically isolating small area segments of an amorphous, thin film, large area photovoltaic device. This isolation of defects is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed.

While the method of Nath is effective in reducing or eliminating the effect of defects, it is not completely satisfactory for several reasons. The step of dividing the semiconductor body of the solar cell into electrically isolated portions requires several production steps and also reduces the total area of the solar cell that is available for producing electrical energy. Further, the method can be time and cost intensive since the electrical output of each isolated portion must be tested and separate electrical connections must be made to provide electrical contact to each small area segment. Also, since an entire segment is effectively eliminated from the final cell if it manifests a defect, proportional losses of efficiency are greater than they would be if only the precise area of the particular defect were eliminated. In addition, it is possible that defects (shorts) in a solar cell can develop after the cell has been in use, and the concept of dividing the body of the large area cell does not correct this type of defect.

Further, both of the foregoing patent applications relate to "after market" techniques which are applicable to (1) isolate only gross defect-containing regions, and (2) prevent any and all current flow through those defect containing regions. Accordingly, a need still exists for a photovoltaic device which substantially eliminates the deleterious effects of shunts and other defects, both large and small, whatever their origin, without operatively removing large portions of the active semiconductor body while maintaining an acceptable level of current flow across the entire surface of the device.

One such method and device is disclosed in commonly assigned U.S. Pat. No. 4,590,327 to Nath, et al, issued May 20, 1986 and entitled "Photovoltaic Device And Method", assigned to the assignee of the subject application and the disclosure which is incorporated herein by reference. Disclosed therein are several configurations of current collecting bus grid structures for photovoltaic devices, said structures specifically designed to minimize the effects of shorts, shunts, and other defects upon the performance of the devices.

A differently configured photovoltaic device and method for eliminating the problems of shorts and shunts is disclosed in U.S. patent application Ser. No. 699,523 of Nath, et al, filed Feb. 8, 1985 and also entitled "Photovoltaic Device And Method", also assigned to the assignee of the subject application and the disclosure of which is incorporated herein by reference. That application concerns a photovoltaic device having the current collecting bus grid structure disposed beneath the upper, transparent conductive electrode thereof. As disclosed, the bus grid structure may optionally have a layer of insulating material disposed directly therebeneath to prevent direct electrical communication with short circuit defects in the body of semiconductor alloy material. Disposing the bus grid structure in such a manner will, as discussed in said application, prevent many of the problems associated with short circuit defects. However, new problems arise in the fabrication of such photovoltaic devices when the bus grid structure is formed as a relatively thick member because there may be instances in which the upper transparent conductive electrode of the photovoltaic device is not thick enough to fully cover a bus grid structure of relatively large thickness (for example greater than 1 micron). When thick bus grid structures are employed, breaks may occur in the transparent conductive oxide layer, which breaks could prevent the efficient communication of electrical current to the bus grid structure. In some cases this problem can be eliminated by making the bus grid structure thinner, as for example when electroplated metal is utilized for the fabrication thereof; however, in many instances it may be desirable or necessary to employ materials such as conductive inks or pastes for the fabrication of the bus grid structure, which materials cannot be readily applied in thin layers. Furthermore, alignment of the bus grid structure with the underlying insulative material necessitates a precise registration thereof, if proper operation of the invention is to be attained.

Another approach to the elimination of short circuit current paths is detailed in U.S. patent application Ser. No. 699,524, of Nath, et al, filed Feb. 8, 1985 and also entitled "Photovoltaic Device and Method", also assigned to the assignee of the subject application and the disclosure of which is incorporated herein by reference. As detailed therein, a photovoltaic device having an increased tolerence to defects is provided by disposing a layer of current flow restricting material beneath at least portions of the bus grid structure in order to prevent the flow of large amounts of current, as would be routinely encountered at a defect site, through the photovoltaic body and to the bus grid. While the invention performs its function of limiting current flow through defective regions of a photovoltaic cell, implementation of the invention is made difficult, particularly in a high-volume production process by the necessity of maintaining vertical alignment of the bus grid structure with the underlying current flow restricting material. Since the bus grid structure includes many finely detailed features, and since the photovoltaic cell is of relatively large area, particular care and control must be exercised to assume this proper registration.

Accordingly, there exists need for a defect tolerant photovoltaic device manufactured by a process which does not require precise alignment steps, i.e., by a process which is particularly suitable for mass production. Disclosed herein are configurations of photovoltaic devices which exhibit a high degree of operational tolerance to the presence of defects therein and which may be fabricated on a mass production basis without requiring precision alignment steps.

BRIEF DESCRIPTION OF THE INVENTION

There is disclosed herein a method of manufacturing an electrical current carrying member having a preselected current carrying capacity. The method comprises the steps of: providing an electrically conductive body; providing an electrically insulating layer atop at least a portion of the conductive body, the insulating layer formed from a material which is at least partially permeable to a solvating reagent; and, depositing an electrically conductive material atop the insulating layer in a preselected pattern. The conductive material includes a solvating reagent, said reagent providing for portions of the electrically conductive material to infiltrate the insulating layer and establish electrical communication with the underlying body so as to provide the current carrying member with a desired current carrying pattern having a preselected current carrying capacity.

In one embodiment of the instant invention the insulating layer is a layer of synthetic polymeric resin, particularly a layer of synthetic polymeric resin having a relatively low degree of cross-linking. In other embodiments of the instant invention, the layer of insulating material comprises a heterogeneous mixture of at least two materials having differing solubility in a given solvating reagent. In another embodiment, the layer of insulating material comprises a layer of uncured photoresist. In still other embodiments, the insulating layer comprises a layer of material chosen from the group consisting essentially of: acrylic polymers, novolac resins, vinyl polymers, styrene polymers, and combinations thereof.

The electrically conductive material may be deposited in a pattern corresponding to at least a portion of a current carrying bus grid structure of a photovoltaic device. The current carrying member may be formed from an electrically conductive silver paste including therein a solvating reagent chosen from the group consisting essentially of: ketones, alcohols, aldehydes, ethers, esters, hydrocarbons, halocarbons, and combinations thereof. The conductive material may be applied to the insulating material by stenciling, silk screen printing, or painting.

The electrically conductive body in some instances may be a semiconductor body, particularly a photoresponsive body such as a photovoltaic body adapted to provide a flow of electrical current in response to absorption of illumination incident thereupon. In one particular embodiment of the instant invention the photovoltaic body includes at least one triad of superposed layers of semiconductor alloy material having an n-i-p configuration.

Also disclosed herein are photovoltaic devices of the type including a semiconductor body, an electrically insulating layer disposed upon at least a portion of the semiconductor body and formed from a material chosen from the group consisting essentially of: solvating reagent permeable insulating material and multiaperatured insulating bodies including a plurality of openings in communication with the underlying semiconductor body. The photovoltaic devices further include a current carrying electrically conductive pattern atop at least a portion of the insulating layer and infiltrating at least a portion of the plurality of openings therein so as to establish electrical communication with the semiconductor body. In photovoltaic devices of this type the area of the infiltrated openings is proportional to the electrical conductivity of the device. In some embodiments of the invention, the insulating layer is a layer of synthetic polymeric material permeable to the solvating reagent whereas in other embodiments the insulating layer is an organic or inorganic insulating material provided with a plurality of openings therein. In one particular embodiment, the insulating body is an inorganic insulator chosen from the group consisting essentially of oxides, nitrides, halides, and combinations thereof.

In another particular embodiment of the instant invention, the photovoltaic device includes a layer of transparent electrically conductive material interposed between the body of photovoltaic material and the electrically insulating material. In other embodiments, the body of photovoltaic material includes at least one triad of semiconductor layers comprised of a layer of intrinsic semiconductor material interposed between oppositely doped semiconductor layers so as to provide an n-i-p type configuration. In still other embodiments, the body of photovoltaic material includes at least two stacked triads of n-i-p type configuration.

DETAILED DESCRIPTION OF THE DRAWINGS

Figure 1:
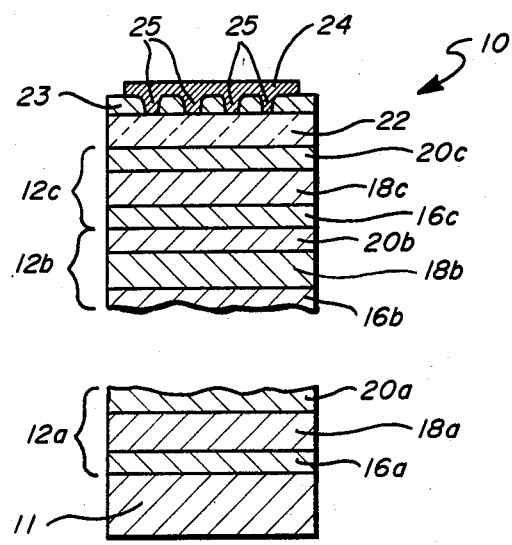
FIG. 1 is a fragmentary, cross-sectional view of a first tandem photovoltaic device structured in accord with the principles of the instant invention and comprising a plurality of n-i-p type photovoltaic cells.
Figure 1:
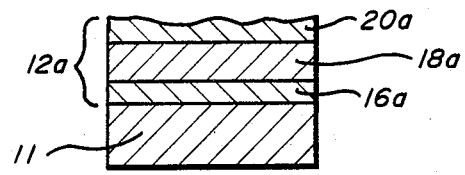

Referring now to the drawings, where like reference numbers designate like structure, and particularly to FIG. 1, a stacked, tandem, or cascade-type, photovoltaic device, formed of successive n-i-p layers each including an amorphous semiconductor alloy, is shown generally by the reference numeral 10. One of the methods of the present invention is, in the preferred embodiment, adapted to produce an improved photovoltaic device of this type. However, that method and other methods, also described herein, are not limited solely to the production of stacked n-i-p photovoltaic cells, but are of equal value in the production of any other type of thin film solar cells, such as, for example, p-i-n devices, p-n devices, Schottky barrier devices, MIS (metal-insulator-semiconductor) type cells, or simply the production of improved thin film semiconductor devices. Regardless of cell type, the novel production methods described herein have their greatest utility in connection with photovoltaic devices formed with uniform layers of semiconductor materials and with a uniform, continuous transparent conductive layer deposited over the semiconductor layers.

It is to be understood that in accordance with the invention, the semiconductor body of the depicted photovoltaic device may be fabricated from any suitable semiconductor material. Suitable semiconductor materials are those which can be formed into thin films and include, by way of example only, and not as a limitation on the present invention, silicon based, germanium based, silicon-germanium based, cadmium sulfide based, and cadmium telluride based semiconductor alloy materials.

FIG. 1 shows a tandem photovoltaic device 10, which includes a photovoltaic semiconductor body 12 adapted to generate a flow of electrical current in response to the absorption of photons incident thereupon, and consisting of a plurality of n-i-p photovoltaic cells 12a, 12b, and 12c. Below lowermost cell 12a is a substrate 11 which may be a metallic member such as an electrically conductive stainless steel sheet, or a thin metallic foil, or which may be formed from an electrically insulating material such as glass, plastic and the like, and provided with an electrically conductive member upon at least a portion thereof.

Although certain applications may require the application of a thin oxide layer and/or a series of base contacts deposited upon the substrate prior to the deposition thereupon of the semiconductor material, for purposes of this application, the term, "substrate" shall also include any elements added thereto by preliminary processing.

As illustrated, each of cells 12a, 12b, and 12c includes a semiconductor body containing at least a silicon alloy. Each of the alloy bodies includes an n-type region or layer (16a, 16b or 16c); an intrinsic region or layer (18a, 18b and 18c); and a p-type region or layer (20a, 20b or 20c). As illustrated, cell 12b is an intermediate cell and, as indicated in FIG. 1, additional intermediate cells may be stacked atop the illustrated cells without departing from the spirit or scope of the present invention. Also, although stacked n-i-p cells are illustrated, this invention is equally adapted for single or stacked p-i-n cells, it being understood that the term "n-i-p type cell" as used herein is meant to include any triad of n, i, and p semiconductor layers operatively disposed to provide a photoactive region for generating charge carriers in response to the absorption of photon energy.

For each of cells 12a, 12b, and 12c, the p-type layers are characterized by low light absorption, high conductivity, layers of preferably microcrystalline, semiconductor alloy material. The intrinsic alloy layers are characterized by an adjusted wavelength threshold for a solar photoresponse, high light absorption, low dark conductivity and high photoconductivity, and may include sufficient amounts of a band gap adjusting element or elements to optimize the band gap for the particular cell application. Preferably, the intrinsic layers are band gap adjusted to provide cell 12a with the lowest band gap, cell 12c with the highest band gap, and cell 12b with a band gap between the other two. The n-type layers are characterized by low light absorption, high conductivity, preferably microcrystalline, alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 25 to 500 angstroms.

The photovoltaic device 10 further includes a layer of transparent electrically conductive material 22, which serves as the top electrode of the photovoltaic device. Layer 22 may be deposited over the semiconductor body 12 in a continuous process, or in a separate environment. In one embodiment, the transparent conductive layer 22 is formed of indium tin oxide although other transparent conductive materials such as zinc oxide, cadmium stannate, tin oxide, and indium oxide are known to skilled practitioners and may also be suitably employed to form the layer.

Figure 2:
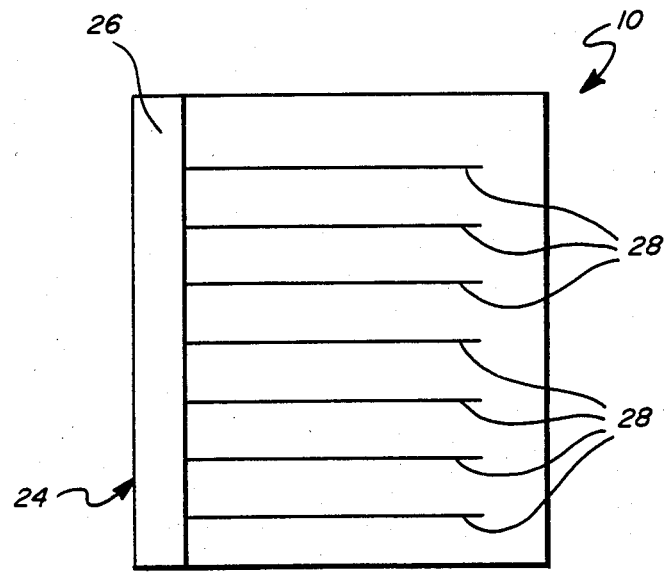
FIG. 2 is a top plan view of a photovoltaic device generally similar to the device of FIG. 1, illustrating the bus grid structure of the instant invention disposed thereupon.

The photovoltaic device 10 also includes current collection means for efficiently withdrawing photogenerated current from the transparent conductive electrode layer 22. As better illustrated in FIG. 2, which is a top plan view of the photovoltaic device 10, the current collection means comprises a bus grid structure 24 which includes a bus bar 26 having a plurality of current collecting grid fingers 28 associated therewith. It will be noted from an inspection of the Figure that the grid fingers 28 which collect photocurrent from the transparent conductive layer (22, FIG. 1) communicate directly with a bus bar 26 which forms one terminal of the photovoltaic device 10 and accordingly, may be connected to another device in a series or parallel arrangement, or may be connected to an electrical load.

Referring back to FIG. 1, it will be noted that the photovoltaic device 10 includes a layer of insulating material 23 interposed between the bus grid pattern 24 and the underlying layer of transparent conductive oxide 22. In accord with the principles of the instant invention, and as depicted in the Figure, the insulating layer 23 includes a number of openings 25 therethrough. These openings 25, allow the electrically conductive material forming the bus grid structure 24 to permeate or infiltrate therethrough and establish electrical communciation with the underlying transparent conductive layer 22. In this manner, photogenerated electrical current is conveyed from the transparent conductive layer 22, through the bus grid pattern 24 to one of the terminals of the photovoltaic cell. Since the bus grid structure 24 does not establish full electrical contact with the transparent conductive layer 22, but rather contacts said layer only where the material forming the bus grid structure 24 infiltrates the insulating layer 23, the amount of electrical current that can pass through to the bus grid structure is effectively buffered or controlled within limits determined by the total area of the openings 25, through which the material of the bus grid structure 24 infiltrates. By thus controlling the flow of electrical current within preselected limits, the deleterious effects resultant from the flow of large amounts of current through short circuits of other defective areas of the photovoltaic cell are prevented.

It should be noted that as used herein the term "openings" is intended to include any passageway, whether macroscopic or microscopic, through which a filament of electrically conductive material can pass for the purpose of establishing electrical communication between superposed and underlying electrically conductive members.

In operation, the infiltrated openings 25 function as current limiting resistors; that is to say they allow relatively unimpeded passage of low current fluxes normally encountered in operation of a photovoltaic cell; however, when a potentially high current flux such as that which occurs in a short circuit region is present, the limited current carrying capacity of the infiltrated opening 25 acts as "bottle neck" which prevents flow of large amounts of current thereby protecting the photovoltaic cell from damage. In this manner, the operation of the infiltrated insulating layer 23 may be compared to resistive members such as cermets and the like which are disposed in precise alignment beneath the bus grid structures of prior art photovoltaic devices. A particularly notable feature, of the instant invention, however resides in the fact that it does not require precise alignment of the bus grid structure with any previously deposited pattern or layer of material, and therefore eliminates expensive, time consuming process steps.

In a first embodiment of the instant invention, the insulating layer 23 is deposited either atop the entire surface of the transparent conductive oxide layer 22, or at least in regions thereof approximating the ultimate location of the bus grid structure 24. In this embodiment, the insulating layer 23 is provided with a plurality of openings 25 everywhere thereupon prior to the deposition of the bus grid pattern 24. The insulating layer 23 may be provided with the openings via many techniques well known to those skilled in the art. Included among such techniques are masking techniques whereby deposition of the insulating layer 23 is carried out through a mask which restricts the area of deposition and thereby forms a pattern of openings. Alternatively, deposition parameters may be adjusted so that the deposited insulating layer 23 agglomerates to form spaced apart islands or clusters having openings therebetween. In still other instances the insulating layer 23 may be deposited as a continuous (i.e. without openings) layer and subsequently etched to form the openings. Such etching may be carried out by well known photolithographic techniques; or alternatively, a heterogeneous mixture of two or more components may be utilized to form the layer, with one of the components being relatively soluble in a given solvent. Exposure of a deposited layer to this solvent will leach out or otherwise remove the soluable component of the heterogeneous mixture leaving a pattern of openings in the insulating layer. In subsequent deposition steps the bus grid pattern 24 is deposited by well known techniques such as evaporation, silk screen printing, stenciling or the like. The conductive material of the bus grid pattern 24 infiltrates the openings 25 in the insulating layer 23 directly therebeneath so as to establish electrical communciation with the underlying transparent conductive layer 22.

In another embodiment of the instant invention, the insulating layer 23 is formed as a continuous layer of material, which material is at least partially permeable to a solvating reagent. In a subsequent step, the bus grid pattern 24 is deposited from a material which includes the solvating reagent to which the material forming the insulating layer is permeable. The solvating reagent thus allows the electrically conductive material forming the bus grid pattern 24 to infiltrate portions of the insulating layer 23 so as to establish electrical communication between the bus grid pattern 24 and the transparent conductive layer 22. By choice of the appropriate insulating material and the appropriate solvating reagent, the degree of infiltration and consequently the current carrying capacity of the bus grid pattern may be controlled to preselected values.

There are a wide variety of electrically insulating materials and solvents therefor, available for practice of the instant invention, it being understood that the invention is not limited to the use of any particular materials. Among some of the materials having utility for the fabrication of the insulating layer are synthetic polymeric resins, particularly those resins having a relatively low degree of "cross linking"; such term being well known to those skilled in the art defined herein to mean a low degree of bridging between adjacent molecular strands of the polymeric matrix. Among such materials are acrylic polymers, vinyl polymers, styrene polymers, novolac resins, as well as various combinations such as mixtures, blends, and co-polymers thereof. One particular material having utility in the instant invention is Shipley Positive Photoresist, a quinone sensitized, novolac resin, photolithographic material sold by the Shipley Corporation.

Bus grid patterns may be effectively and economically applied to photovoltaic devices in a large scale process by printing, silk screening, stenciling, or painting an electrically conductive silver paste thereonto. Such pastes generally include an organic solvent, such as methyl ethyl ketone, therein which solvent will readily infiltrate a wide variety of synthetic polymeric materials. Among other solvating reagents capable of infiltrating synthetic polymeric insulating materials and having utility in the practice of the instant invention are other ketones, alcohols, aldehydes, ethers, esters, hydrocarbons, halocarbons and various combinations and blends thereof.

In one embodiment of the instant invention, a tandem n-i-p photovoltaic cell having a top transparent conductive oxide layer formed of indium tin oxide was coated with an approximately 1 to 10 micron thick layer of the aforementioned Shipley photoresist. The photoresist was not exposed to activating radiation, that is to say, it was maintained in its highly soluble, relatively uncrosslinked state. After the photoresist was dry, the bus grid pattern was applied by silk screen printing an electrically conductive silver paste, such as Cu 127, a trademark of the Amicon Corporation. After approximately one half hour drying time at 90° C. it was found that the conductive silver paste had infiltrated the insulating layer and established electrical communication with the transparent conductive layer of the cell. Similar results were found when the insulating layer was fabricated from a 10 micron thick layer of acrylic polymer.

There are a wide variety of other polymeric materials which are good electrical insulators and which may be dissolved in a variety of solvents. By appropriate choice of materials a routineer skilled in the art can effectively and reliably control the degree of infiltration of the conductive material and consequently attain desired electrical conductivity. For example, the degree of infiltration may be controlled by selection of the proper solvent or blend of solvents. It is known that the solvating power of a mixture may be controlled by utilizing a solvent system comprised of a non-solvent mixed with a solvent material.

In another embodiment of the subject invention, the insulating layer may be formed from a heterogeneous mixture of two components having differing solubility as described hereinabove. The bus grid pattern may subsequently be applied thereto by employing a material containing a solvent for one of the components of the mixture. The solvent will permeate the component of the mixture which it is capable of dissolving and will thus allow the material forming the bus grid pattern to infiltrate therethrough.

After the limited conductivity electrical connection is established through any of the techniques described hereinabove, the photovoltaic cell is ready for immediate use or it may under go subsequent processing such as encapsulation, modularization, or other such processing steps. In cases where the insulating layer 23 is fabricated from a relatively transparent material, such material may be left on the photovoltaic cell insofar as light will pass therethrough uninhibited. In other cases, it may be desirable to remove the remaining insulating material. Removal may be accomplished by any one of many stripping techniques well known to those skilled in the art.

While the foregoing description has represented the insulating layer as being disposed everywhere atop the transparent conductive layer, other arrangements may be advantageously employed in keeping with the principles of the instant invention. For example, the insulating material may be disposed in regions which will approximate the location of the to-be-deposited bus grid pattern. With such an arrangement, there will be some necessity for alignment and registration; however the alignment need not be very precise insofar as the insulating layer may cover an area significantly greater than the area to be covered by the bus grid pattern.

While the cell illustrated in FIG. 1 is a stacked assembly of n-i-p type cells, the instant invention is also applicable to other cell arrangements such as single n-i-p cells, as well as stacked or single p-i-n cells, p-n cells, Schottky barrier cells, and the like. Accordingly, in the description and claims the layer or layers of semiconductor material disposed between substrate 11 and the bus grid structure 24 are generally referred to as the "semiconductor body," or the "photovoltaic body". These terms are intended to include any combinations of semiconductor layers of various conductivities and materials which will provide for a flow of electrical current when appropriately combined with one or more electrodes. This flow of electrical current specifically defined to include the switching of current accomplished by photodiodes and phototransistors as well as the generation and collection of current accomplished by photovoltaic devices such as solar cells. Regardless of the device's ultimate configuration, it is for the purposes of substantially reducing the rate of flow of current through low resistance current paths through the substrate electrode that the current collection means of the instant invention was developed.

While the instant invention has been described with reference to particular photovoltaic embodiments, the utility thereof is not so limited and the principles thereof may be advantageously employed in the fabrication of a variety of other types of electronic devices in which it is desirable to limit flow of electrical current therethrough to a preselected value. Among such devices are transistors, including power transistors, diodes, capacitors, integrated circuitry, memory arrays and the like. It is to be understood that numerous changes, modifications and substitutions may be made in accord with the principles of the instant invention. The drawings and description thereof are meant to be illustrative of the principles and practices of the instant invention and not limitations thereupon. It is the following claims, including all equivalents, which are meant to define the instant invention.

We claim:

1. A photovoltaic device having a preselected current carrying capacity, said device including:

a semiconductor body;

an electrically insulating layer disposed upon at least a portion of said semiconductor body, said layer formed from a synthetic polymeric material permeable to a solvating reagent, said layer including therein a plurality of openings in communication with the underlying semiconductor body; and, a current carrying, electrically conductive material deposited in a preselected pattern atop at least a portion of said insulating layer and infiltrating at least a portion of said plurality of openings so as to establish electrical communication with said semiconductor body.

2. A photovoltaic device as in claim 1, wherein said insulating layer comprises a heterogenous mixture of at least two materials having differing solubility in a given solvating reagent.

3. A photovoltaic device as in claim 1, wherein said insulating layer comprises a layer of uncured photoresist.

4. A photovoltaic device as in claim 1, wherein said insulating layer comprises a material chosen from the group consisting essentially of: acrylic polymers, novolac resins, vinyl polymers, styrene polymers and combinations thereof.

5. A photovoltaic device as in claim 1, wherein said electrically conductive pattern forms at least a portion of a bus grid structure of said device.

6. A photovoltaic device as in claim 1, wherein said electrically conductive pattern is formed from a conductive silver paste.

7. A photovoltaic device as in claim 1, wherein said synthetic polymeric reagent is permeable to a solvent chosen from the group consisting essentially of: ketones, alcohols, aldehydes, ethers, esters, hydrocarbons, halocarbons and combinations thereof.

8. A photovoltaic device as in claim 1, wherein said semiconductor body includes a body of photovoltaic material adapted to provide a flow of electrical current in response to the absorption of light incident thereupon.

9. A photovoltaic device as in claim 8, wherein said semiconductor body further includes a layer of transparent, electrically conductive material interposed between said body of photovoltaic material and said electrically insulating layer.

10. A photovoltaic device as in claim 8, wherein said body of photovoltaic material includes at least one triad comprised of a layer of intrinsic semiconductor material interposed between oppositely doped semiconductor layers so as to provide an n-i-p configuration.

11. A photovoltaic device as in claim 10, wherein said body of photovoltaic material includes at least two stacked triads of n-i-p configuration.

* * * * *